(12) United States Patent
Lam et al.

(10) Patent No.: US 10,014,203 B2
(45) Date of Patent: Jul. 3, 2018

(54) PICK AND PLACE DEVICE COMPRISING PICK ARM CORRECTION MODULE

(71) Applicant: ASM Technology Singapore Pte Ltd, Singapore (SG)

(72) Inventors: Kui Kam Lam, Kwai Chung (HK); Kai Siu Lam, Kwai Chung (HK); Zhuanyun Zhang, Kwai Chung (HK); Nim Tak Wong, Kwai Chung (HK); Chung Yan Lau, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 135 days.

(21) Appl. No.: 15/043,013

(22) Filed: Feb. 12, 2016

(65) Prior Publication Data

US 2017/0236734 A1    Aug. 17, 2017

(51) Int. Cl.
*H01L 21/68* (2006.01)
*G05B 19/404* (2006.01)

(52) U.S. Cl.
CPC .......... *H01L 21/681* (2013.01); *G05B 19/404* (2013.01); *G05B 2219/45063* (2013.01)

(58) Field of Classification Search
CPC ...... H01L 21/681; H01L 21/68; B25J 9/1692; B25J 9/1697; G05B 2219/40623; G05B 2219/37571; G05B 2219/39008; G05B 2219/39046; G05B 2219/45031; G05B 19/404; G05B 2219/49169; G05B 2219/49207; G05B 2219/39033; G05B 2219/45062; G08B 2219/45063
See application file for complete search history.

(56) References Cited

U.S. PATENT DOCUMENTS

| | | | | |
|---|---|---|---|---|
| 6,208,419 B1* | 3/2001 | Yamamoto | ........ | H01L 21/67144 356/400 |
| 6,648,730 B1* | 11/2003 | Chokshi | ................ | B24B 37/345 250/206.1 |
| 2003/0202092 A1* | 10/2003 | Sadighi | ................. | B25J 9/1692 348/87 |
| 2013/0183131 A1* | 7/2013 | Blank | ...................... | B25J 18/04 414/744.5 |
| 2013/0325179 A1* | 12/2013 | Liao | ...................... | B25J 9/1692 700/254 |

* cited by examiner

*Primary Examiner* — Dale Moyer
(74) *Attorney, Agent, or Firm* — Ostrolenk Faber LLP

(57) ABSTRACT

A semiconductor die pick and place device comprising a handing mechanism comprising a pick arm movable between a placement location and a pick-up location. A reference feature is located on the pick arm, and a light reflecting module is carried by the pick arm. The light reflecting module is operable to reflect an image of the reference feature to an image capturing module such that the reference feature appears to the light reflecting module to be in focus at a virtual position that is equivalent to a position at the pick-up location and/or the placement location.

20 Claims, 6 Drawing Sheets

PICK AND PLACE DEVICE COMPRISING PICK ARM CORRECTION MODULE

FIELD OF THE INVENTION

The invention relates to a device and method for picking and placing semiconductors, such as for die sorting or die bonding applications.

BACKGROUND

A pick and place device is a device that is used to pick up an object from a first station and thereafter to place or release the object in a second station. Pick and place devices are typically used in various semiconductor manufacturing processes, such as die bonding and die sorting.

After a semiconductor wafer has been fabricated, the semiconductor wafer is usually mounted onto an adhesive film such as Mylar film, and subsequently singulated into individual semiconductor dice. The semiconductor dice may be tested either before or after singulation, in order to generate information for completing a wafer map containing characteristics of each semiconductor die together with its position in the wafer. The semiconductor dice may then be sorted based on the wafer map generated. A die sorting process may involve sorting good dice from defective dice, or sorting dice such as light-emitting diodes (LEDs) according to their electrical properties, light intensity, and frequency.

A pick and place device may be used to sort the semiconductor dice. A pick arm comprising a pick head is used to pick up a semiconductor die and transfer it to an appropriate bin. The die sorting process generally requires the pick head to be accurately positioned with respect to the semiconductor die to be picked up, or the location or bin where the semiconductor die is to be placed. However, pick and place devices are often operated for long hours at high transfer speeds, which may cause the mechanical parts in the pick arms to expand due the heat generated. The thermal expansion of the pick arm would cause its pick head to shift from its original position such that its positioning is no longer accurate, thus resulting in errors during pick-and-place operations.

During a die bonding process, a semiconductor die is mounted onto a substrate. The substrate is transported to a dispensing station where adhesive is applied onto bonding locations on the substrate, and thereafter the substrate is moved to a bonding station. At the bonding station, a semiconductor wafer comprising separated semiconductor dice adhering to an adhesive film clamped in a frame are provided on a wafer table. A pick and place device picks up each semiconductor die and places it onto a respective bonding location on the substrate. The picking and removal of the semiconductor dice from the adhesive film and the placing of the semiconductor dice onto the substrate, are processes that require high precision, especially as sizes of semiconductor dice and and their bonding locations become smaller with technological advancements. As explained above, pick and place devices are often operated for long hours at high transfer speeds, which may cause their pick arms to expand due the heat generated. The thermal expansion of the pick arm would cause its the pick head to shift from its position and resulting in errors.

SUMMARY OF THE INVENTION

It is thus an object of this invention to seek to provide a device and method for picking and placing semiconductors which may automatically compensate for the aforesaid errors.

According to a first aspect, there is provided a semiconductor die pick and place device comprising: a handing mechanism comprising a pick arm movable between a placement location and a pick-up location; a reference feature located on the pick arm; and a light reflecting module carried by the pick arm; wherein the light reflecting module is operable to reflect an image of the reference feature to an image capturing module such that the reference feature appears to the light reflecting module to be in focus at a virtual position that is equivalent to a position at the pick-up location and/or the placement location.

According to a second aspect, there is provided a method of picking and placing a semiconductor die, the method comprising the steps of: providing a handling mechanism comprising a pick arm movable between a pick-up location and a placement location; providing a reference feature on a pick arm; carrying a light reflecting module with the pick arm; and reflecting an image of the reference feature to an image capturing module, such that the reference feature appears to the light reflecting module to be in focus at a virtual position that is equivalent to a position at the pick-up location and/or the placement location.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Figure 1:
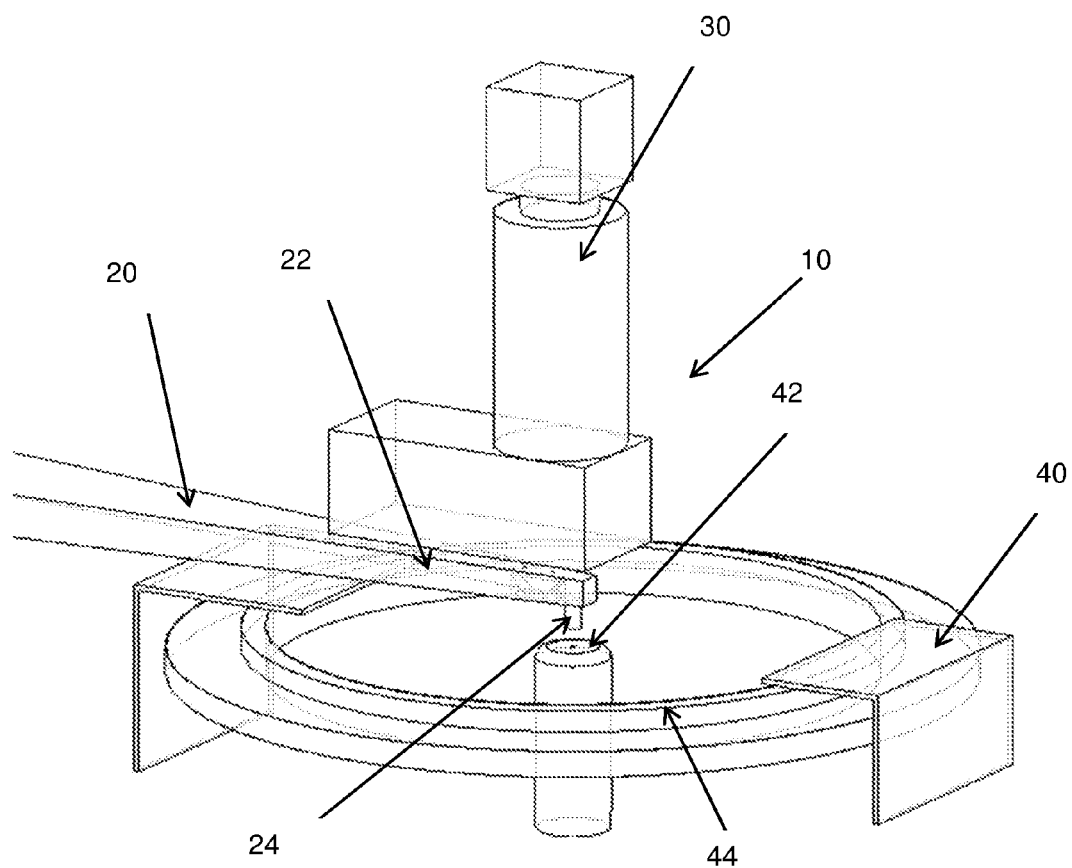
FIG. 1 is a perspective view of a pick and place device according to the preferred embodiment of the present invention for picking semiconductor dice from a pick-up location and placing the semiconductor dice at a placement location.

FIG. 1 is a perspective view of a pick and place device 10 according to the preferred embodiment of the present invention for picking semiconductor dice from a pick-up location and placing the semiconductor dice at a placement location. The pick and place device 10 comprises a handling mechanism 20 movable between a wafer table 40 at the pick-up location and the placement location. An image capturing device 30 is located above the wafer table 40 at the pick-up location. The handling mechanism 20 comprises a pick arm 22 which supports a pick head 24 located at a free end of the pick arm 22. The pick arm 22 is movable between the pick-up location and the placement location. The wafer table 40 comprises a wafer ring 44 for supporting a wafer (46, see FIG. 2), and an ejector 42 which is movable along the XYZ axes independently of the wafer ring 44.

Figure 2:
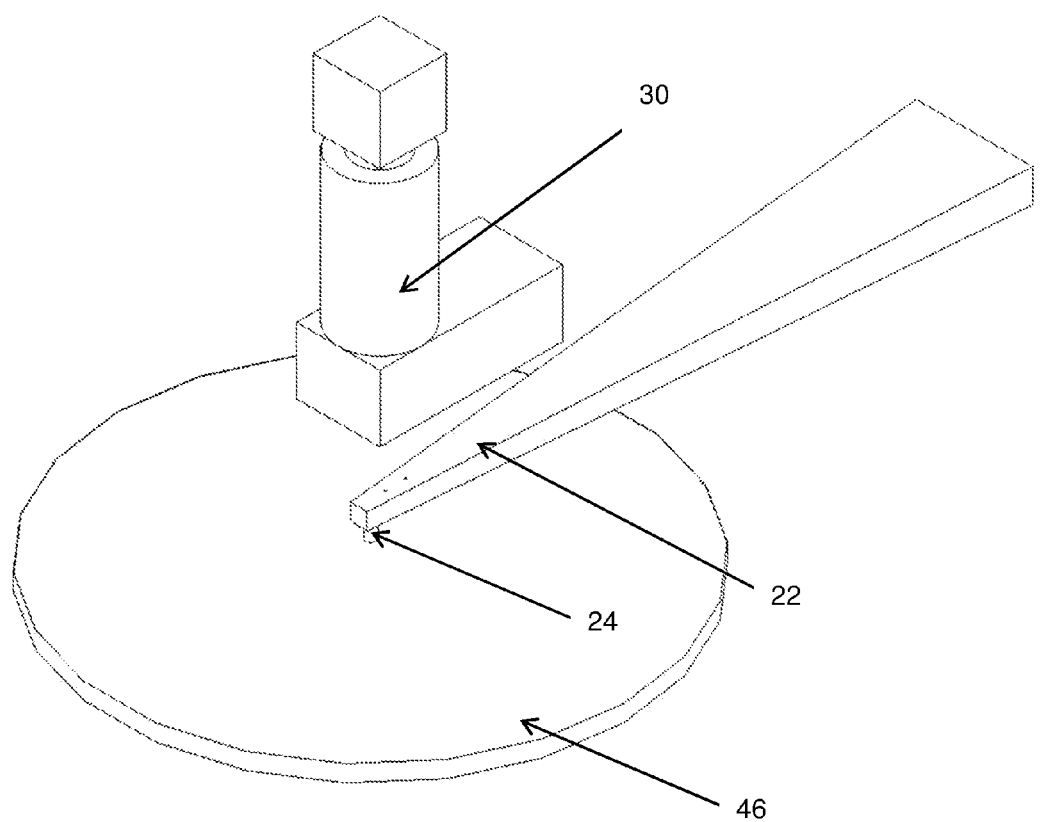
FIG. 2 is a perspective view of the pick and place device at the pick-up location with its pick arm positioned above the wafer and below the image capturing device.

FIG. 2 is a perspective view of the pick and place device 10 at the pick-up location with its pick arm 22 positioned above the wafer 46 and below the image capturing device 30. The wafer 46 is mounted on an adhesive film held by the wafer ring 44. The wafer table 40 is movable along the XY axes, and rotatable to compensate for any angular positional error of the wafer 46 or the semiconductor die to be picked up with respect to the pick head 24.

The handling mechanism 20 is powered by driver motors, for movement along the XYZ axes. In particular, the handling mechanism 20 is powered by a rotational driver motor to drive the pick arm 22 to rotate about a rotational axis of the handling mechanism 20. The pick-up location and the placement location may be positioned at various locations about the circumference of a circle traced by the pick head 24 as the pick arm 22 is rotated about the rotational axis of the handling mechanism 20. For instance, the pick-up location and the placement locations may be spaced about 90° and/or 180° apart, where the picking position could be at a 12 o'clock position, while the placement locations could be at 3 o'clock, 6 o'clock, and/or 9 o'clock positions.

The ejector 42 is positioned under the wafer 46 and it assists the pick arm 22 to pick up each semiconductor die. When the pick arm 22 moves downwards towards the wafer 46 to pick up a semiconductor die, the ejector 42 would synchronously move upwards to push the semiconductor die upwards, thus making the semiconductor die partially detach from the adhesive film so that the pick head 24 can easily pick up the semiconductor die. The adhesive film may be held in position by vacuum suction provided at the wafer table 40 below the adhesive film.

Figure 3:
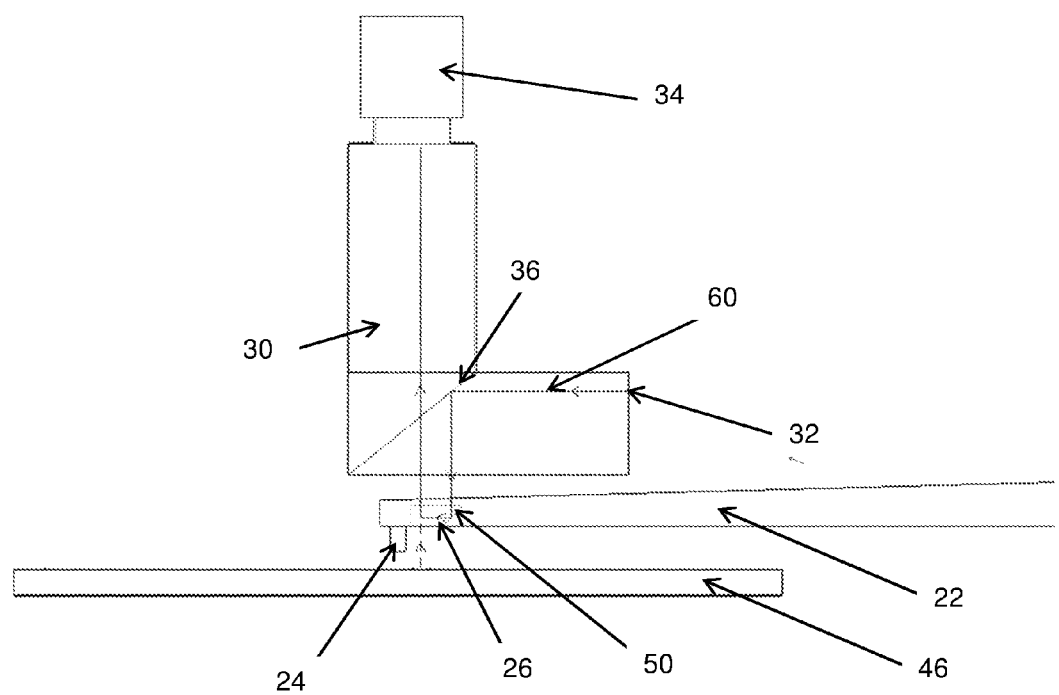
FIG. 3 is a side view of the pick and place device comprising a prism within a cavity of the pick arm.

FIG. 3 is a side view of the pick and place device 10 comprising a prism 50 within a cavity 26 of the pick arm 22. The pick arm 22 is positioned above the wafer 46 at the pick-up location. A light reflecting module such as the prism 50 is located in the cavity 26, proximate the free end of the pick arm 22 and close to the pick head 24. The image capturing device 30, which is positioned above the wafer 46 and the pick arm 22 at the pick-up location, comprises a light source 32, a reflective surface 36, and a camera 34. The light source 32 emits light which travels along a light path 60 extending from the light source 32, through the prism 50 in the cavity 26 of the pick arm 22, and finally to the camera 34. The pick and place device 10 may also comprise a respective image capturing device 30 at each of the placement locations.

Figure 4:
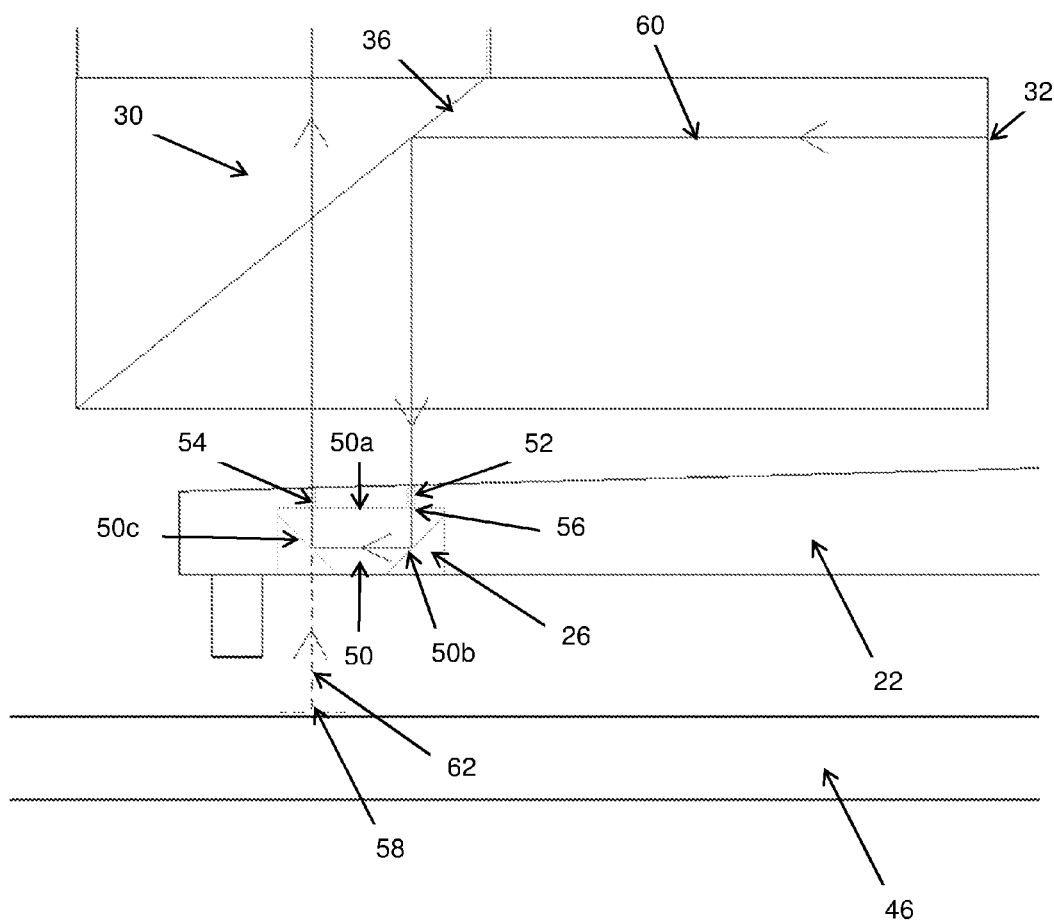
FIG. 4 is a side view of a portion of the light path relative to the pick arm.

FIG. 4 is a side view of a portion of the light path 60 relative to the pick arm 22. The light path 60 extends from the light source 32 to the reflective surface 36 where the light is reflected by about 90° towards the pick arm 22, out from a bottom surface of the image capturing device 30, through a first through-hole 52, to reach the prism 50 which is in the cavity 26. The light traces a U-shaped path within the prism 50, by entering the prism 50 through a surface 50a at the longer parallel side of the trapezoidal cross-section of the prism 50, being reflected by about 90° at each of the surfaces 50b, 50c at the inclined sides of the trapezoidal cross-section of the prism 50, and exiting the prism 50 from the same surface 50a where it entered the prism 50. Hence, the light continues to travel along the light path 60 into the prism 50 from the first through-hole 52, exits the prism 50 towards a second through-hole 54, travels through the second through-hole 54, enters the image capturing device 30 through the same bottom surface of the image capturing device 30, and is received by the camera 34.

A reference feature 56 is placed on the surface 50a of the prism 50 at the position where the light travelling along the light path 60 enters the prism 50, such that the image of the reference feature 56 is captured by the camera 34. The position of the reference feature 56 corresponds to the position of the first through-hole 52, such that the light that travels through the first through-hole 52 illuminates the reference feature 56. Thereafter, the light enters the prism 50 through the surface 50a and carries the image of the reference feature 56 along the light path 60. The image of the reference feature 56 is reflected by both the inclined surfaces 50b, 50c of the prism 50, exits the surface 50a of the prism 50, travels through the second through-hole 54, enters the image capturing device 30 through the bottom surface of the image capturing device 30, and is received by the camera 34. The distance the light travels from the reference feature 56 to the camera 34 along the light path 60, is the same as the distance that the light would have travelled along a virtual light path 62 from a virtual position 58 to the camera 34. Therefore, the reference feature 56 would appear to be positioned at the virtual position 58. The virtual position 58 is designed to be an indication of where the semiconductor die to be picked up should be positioned relative to the pick arm 22 during die pick-up. The reference feature appears to the light reflecting module to be in focus at the virtual position that is equivalent to a position at the pick-up location and/or the placement location, because the distance that the light travels from the reference feature to the image capturing module is configured to be the same as the distance the light would have travelled from the virtual position to the image capturing module. The reference feature 56 may also be positioned at other appropriate positions within the cavity 26. This has the advantage of protecting the reference feature 56 from damage.

A processor (not shown) processes the image of the reference feature 56 captured by the camera 34 wherein the reference feature 56 would appear to be positioned at the virtual position 58, and determines the relative position of the pick arm 22 based on such image of the reference feature 56 which appear to be positioned at the virtual position 58. The position information of the pick arm 22 is then stored in a storage medium. After one or more pick and place cycles, the pick arm 22 and the pick head 24 may shift or change positions due to thermal expansion and mechanical movement. Hence, the pick and place device 10 may be configured to check the position of the pick head 24 of the pick arm 22 after every pick and place cycle, or after a predetermined number of cycles. Each time a new position of the pick head 24 is determined, the new position information may be compared with the previous or a number of previous position information, such that any changes in the position of the pick head 24 may be detected.

When a change in the position of the pick head 24 is detected, correction may be performed at the pick-up location by adjusting the position of the pick arm 22 and pick head 24 relative to the position of the wafer 46 or the position of the semiconductor die to be picked up. During correction at the pick-up location, the wafer table 40 holding the wafer 46 is moved along the XY axes to compensate for the modified position of the pick arm 22. The pick arm 22 may also be adjusted instead of or in addition to moving the wafer ring 44, to correct the position of the pick arm 22 relative to the position of the wafer 46 or the semiconductor die to be picked up. The ejector 42 is also moved in order to position the ejector 42 correspondingly below the semiconductor die to be picked up.

Correction may also be performed at the placement location, where the semiconductor die may be placed in a bin or mounted onto a substrate. During correction at the placement location, the bin or the substrate is moved along the XY axes to compensate for the modified position of the pick arm 22. The relative position between the pick head 24 and the bin or the substrate is adjusted, to compensate for the modified position of the pick arm 22. The pick arm 22 may also be adjusted instead of or in addition to moving the bin or the substrate.

Figure 5:
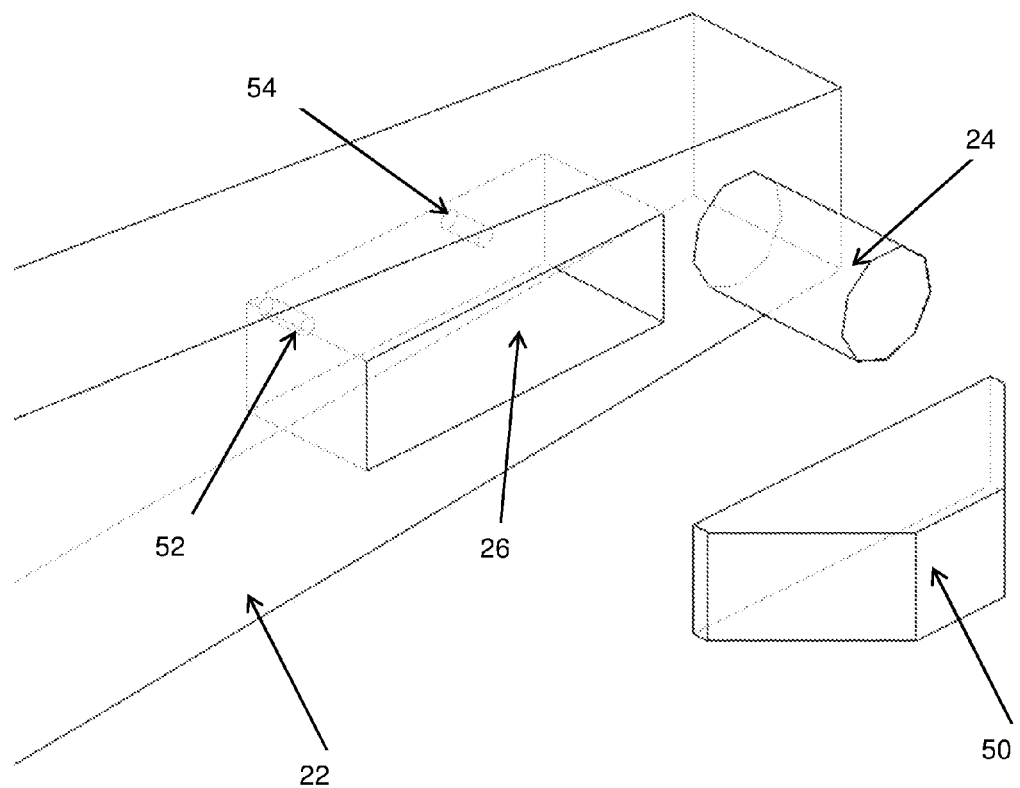
FIG. 5 is an enlarged bottom view of the pick arm with its prism removed.

FIG. 5 is an enlarged bottom view of the pick arm 22 with its prism 50 removed. The pick arm 22 has modified portions at its bottom surface defining the cavity 26. The cavity 26 is located between the ends of the pick arm 22 and is preferably adjacent to or proximate the pick head 24, in order to provide a better view of the reference feature 56 and a more accurate indication of the position of the pick head 24. The cavity 26, which is cuboidal in shape, is dimensioned to fit the trapezoidal prism 50. The prism 50 comprises a trapezoidal cross-section, although other shapes are also possible to vary the light path. The trapezoidal prism 50 is housed within the cuboidal cavity 26 of the pick arm 22 in a compact manner, which not only allows the pick arm 22 to operate efficiently, but also protects the prism 50 and the reference feature 56 from damage. This also avoids additional air resistance during movement of the pick arm 22 since the prism 50 is not exposed, and further increases efficiency while reducing the risk of damage to the prism 50. The pick arm 22 further comprises the first through-hole 52 and the second through-hole 54, both of which extend from a top surface of the pick arm 22 to the cavity 26.

Figure 6:
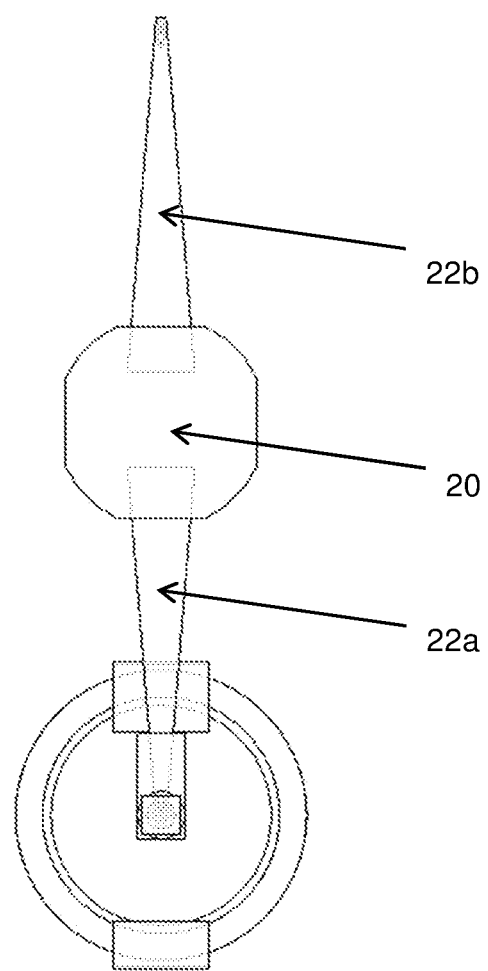
FIG. 6 is a plan view of a handling mechanism comprising two pick arms that are rotatable about a common axis.

FIG. 6 is a plan view of the handling mechanism 20 comprising two pick arms 22a, 22b rotatable about a common axis. The handling mechanism 20 comprising the two pick arms 22a, 22b has an advantage of being more efficient because the first pick arm 22a may be picking a semiconductor die from the pick-up location while the second pick arm 22b is placing another semiconductor die at the placement location, thus performing two simultaneous actions. By accommodating multiple pick arms 22 that are rotatable about a common axis, the handling mechanism 20 improves efficiency with limited increase to the footprint of the pick and place device 10.

Positioning the image capturing device 30 above the wafer table 40 at the pick-up location requires only one image capturing device 30 that is operative to determine the positions of the respective pick arms 22 at the pick-up location. A respective image capturing device 30 may be positioned at each pick-up location or placement location, in order to determine the positions of the pick arms 22 at each of these locations.

The pick and place device 10 according to the preferred embodiment of the present invention may be used in any appropriate process requiring pick and place capability, besides die bonding and die sorting processes. A LED die sorting process using the pick and place device 10 according to the preferred embodiment of the present invention will now be described. A wafer 46 comprising a plurality of LEDs which are mounted on an adhesive film is held by a wafer ring 44 at a pick-up location. The wafer table 40 may provide vacuum suction to hold the adhesive film against the wafer table 40. The LEDs on the wafer 46 are tested to generate information to complete a wafer map. The LEDs are then sorted based on the wafer map generated, according to tested characteristics such as their electrical properties, light intensity, and frequency.

A pick arm 22 is positioned over a LED to be picked up at the pick-up location. An image capturing device 30 captures an image of a reference feature 56. A processor processes the image of the reference feature 56 captured by the camera 34, wherein the reference feature 56 appears to be positioned at a virtual position 58, and determines the relative position of the pick arm 22.

Underneath the adhesive film, an ejector 42 which is movable along the XYZ axes is positioned below the LED to be picked up. The ejector 42 is moved vertically along the Z-axis until it contacts the LED to be picked up and lifts the LED to promote delamination of the LED from the adhesive film. Once the LED is adequately delaminated the pick arm 22 is lowered until a pick head 24 contacts the LED. The pick head 24 comprising a vacuum channel, applies vacuum suction onto the LED to hold the LED in place against the pick head 24. The pick arm 22 is raised, thereby removing the LED from the adhesive film.

The pick arm 22 is then rotated about an axis of a handling mechanism 20, to one of a plurality of placement locations whereat the pick arm 22 may place the sorted LED into bins at a bin table. Thereafter, the pick arm 22 rotates back to the pick-up location, thereby completing one pick and place cycle. The pick and place device 10 repeats the pick and place cycle until all of the plurality of the LEDs of the wafer 46 have been sorted and placed onto appropriate placement locations based on the wafer map.

As the pick head 24 may shift or drift in position after a plurality of pick and place cycles due to mechanical movements and thermal expansion of the mechanical parts, this may cause the pick head 24 to be misaligned with respect to the LED to be picked up. Thus, the pick head 24 may be unable to correctly pick up the LED. With the described preferred embodiment of the invention, corrections to the relative position of the pick arm 22 may be performed to compensate for any shift and drift in position of the pick head 24.

The image capturing device 30 captures the image of the reference feature 56 after each pick and place cycle or after a predetermined number of pick and place cycles, and a processor determines a new position of the pick head 24. When the position of the pick head 24 has shifted or drifted, the position of the pick head 24 relative to the position of the LED to be picked would also shift or drift. Therefore the position of the pick arm 22 relative to the position of the LED to be picked up needs to be corrected, otherwise the pick head 24 may be unable to correctly pick up the LED. The position of bin tables at the placement locations relative to the position of the pick arm 22 may also be corrected, such that the pick head is able to correctly place the LED at each bin at the bin table. The new position information of the pick arm 22 is compared to its previous position or a number of previous positions to determine the distance the pick arm 22 has shifted or drifted. A predetermined threshold relating to a distance the pick head 24 has shifted or drifted may also be set such that no correction is required if the shift or drift is below the predetermined threshold.

The processor calculates a compensation factor, and the wafer table 40 holding the wafer 46 is moved along the XY axes for a distance equal to the compensation factor, to compensate for the shift or drift in the position of the pick head 24. The ejector 42 is also moved along the XY axes for a distance equal to the compensation factor in order to position the ejector 42 correspondingly below the LED to be picked up. The bin table at the placement position may also be moved along the XY axes for a distance equal to the compensation factor, in order to compensate for the shift or drift in the position of the pick head 24. The processor may calculate the compensation factor by taking into account only the new position information, such that the relative position of the pick arm 22 to the LED to be picked up is adjusted to be the same as the previous relative position. The processor may also calculate the compensation factor by taking into account the new position information together with the previous position or a number of previous positions, which has an advantage of reducing measurement noise or error. For example, the processor may calculate a compensation factor from an average of the new position and nineteen previous positions.

It would thus be appreciated that the pick and place device 10 according to the preferred embodiment of the present invention has an advantage of being able to minimize picking and/or placing errors, especially in high speed pick and place processes. This will help to reduce machine down time due to die pick up failures and die placement failures, and will also help to increase the equipment lifetime of the pick head 24 and the ejector 42.

Although the present invention has been described in considerable detail with reference to certain embodiments, other embodiments are possible.

For example, the image capturing device 30 may be operative to not only check the position of the pick head 24, it may also be configured to inspect the wafer 46 and the semiconductor dice on the wafer 46. Additional image capturing devices 30 may be included in the pick and place device 10, for example by including an up-looking camera for inspecting the pick head 24 or the semiconductor die picked up by the pick head 24.

The cavity 26 has been described to be proximate the free end of the pick arm 22, but the cavity 26 may also be positioned elsewhere in the pick arm 22. The pick head 24 may comprise, but is not limited to, a nozzle, a gripper, a collet, a vacuum holder, or a bond head, depending on the process and the object to be picked up. Instead of the prism 50, the reflection module may also comprise any other type of reflective surfaces, such as a mirror. For example, the prism 50 may be replaced with two reflective surfaces or two prisms at the positions of the inclined surfaces 50b, 50c.

The handling mechanism 20 may have a plurality of pick arms 22 equally spaced apart, for example, the handling mechanism 20 may have four pick arms 22 spaced about 90° apart.

Therefore, the spirit and scope of the appended claims should not be limited to the description of the embodiments contained herein.

The invention claimed is:

1. A semiconductor die pick and place device comprising:
a handing mechanism comprising a pick arm movable between a placement location and a pick-up location;
a reference feature located on the pick arm; and
a light reflecting module carried by the pick arm,
wherein the light reflecting module is operable to reflect an image of the reference feature to an image capturing module such that the reference feature appears to the image capturing module to be in focus at a virtual position that is equivalent to a position at at least one of the pick-up location and the placement location.

2. The semiconductor die pick and place device of claim 1, wherein the light reflecting module comprises two reflective surfaces.

3. The semiconductor die pick and place device of claim 1, wherein the light reflecting module comprises a prism.

4. The semiconductor die pick and place device of claim 3, wherein the prism comprises a trapezoidal cross section.

5. The semiconductor die pick and place device of claim 1, wherein the reference feature is located on a surface of the light reflecting module.

6. The semiconductor die pick and place device of claim 1, wherein the pick arm comprises portions defining a cavity.

7. The semiconductor die pick and place device of claim 6, wherein the reference feature is located within the cavity of the pick arm.

8. The semiconductor die pick and place device of claim 6, wherein the pick arm further comprises a first through-hole and a second through-hole,
wherein the first and second through-holes are connected to the cavity.

9. The semiconductor die pick and place device of claim 8 wherein:
the first through-hole is operable to allow light to illuminate the reference feature; and
the second through-hole is operable to allow the image of the reference feature to travel from the light reflecting module to the image capturing module.

10. The semiconductor die pick and place device of claim 6, wherein the light reflecting module is located within the cavity of the pick arm.

11. The semiconductor die pick and place device of claim 6, wherein the handing mechanism further comprises a pick head located at a free end of the pick arm,
wherein the cavity is proximate the pick head.

12. The semiconductor die pick and place device of claim 1, wherein the pick arm is rotatable about an axis of the handling mechanism.

13. The semiconductor die pick and place device of claim 1, wherein the handling mechanism further comprises another pick arm, wherein the pick arms are rotatable about a common axis.

14. The semiconductor die pick and place device of claim 13, wherein the pick arms are located 180° apart.

15. The semiconductor die pick and place device of claim 1, wherein the location of the image capturing device is fixed at the pick-up location or the placement location.

16. The semiconductor die pick and place device of claim 1, further comprising a processor operable to determine the position of the pick arm from the image of the reference feature captured by the image capturing device, and to calculate a compensation factor for adjusting the position of a semiconductor die relative to the position of the pick arm.

17. The semiconductor die pick and place device of claim 16, wherein the processor is operable to calculate the compensation factor taking into account the current position of the pick arm and a plurality of previous positions of the pick arm.

18. The semiconductor die pick and place device of claim 16, wherein the position of the pick arm relative to the position of the semiconductor die is corrected based on the compensation factor.

19. The semiconductor die pick and place device of claim 1, wherein the light that travels from the reference feature to the image capturing module is configured to travel through a prism and a through-hole to reach the image capturing module.

20. A method of picking and placing a semiconductor die, the method comprising:
providing a handling mechanism comprising a pick arm movable between a pick-up location and a placement location;
providing a reference feature on the pick aim;
carrying a light reflecting module with the pick arm; and
reflecting an image of the reference feature to an image capturing module, such that the reference feature appears to the image capturing module to be in focus at a virtual position that is equivalent to a position at at least one of the pick-up location and the placement location.

* * * * *